United States Patent [19]

Strong

[11] Patent Number: 5,699,739

[45] Date of Patent: Dec. 23, 1997

[54] ASSEMBLY AND METHOD FOR RECLAIMING INCOMPATIBLE RESINS FROM PRINTING PLATES

[75] Inventor: Kenneth M. Strong, Hockessin, Del.

[73] Assignee: MacDermid Imaging Technology, Waterbury, Conn.

[21] Appl. No.: 741,700

[22] Filed: Oct. 31, 1996

[51] Int. Cl.⁶ .............................. B41M 5/00; B41F 35/00
[52] U.S. Cl. ................... 101/463.1; 101/423; 15/256.52
[58] Field of Search .................... 101/463.1, 423, 101/425, 478; 15/256.51, 256.52, 256.53

[56] References Cited

U.S. PATENT DOCUMENTS

| | | | |
|---|---|---|---|
| 4,478,931 | 10/1984 | Fickes et al. | 430/309 |
| 4,765,242 | 8/1988 | Oya et al. | 101/425 |
| 5,328,511 | 7/1994 | Beisswanger | 118/203 |

Primary Examiner—Edgar S. Burr
Assistant Examiner—Dave A. Ghatt
Attorney, Agent, or Firm—William A. Simons; Wiggin & Dana

[57] ABSTRACT

The nonpolymerized portion of the resin on a photopolymerizable resin is recovered from a printing plate by squeezing the liquid resin off of the plate with the doctor roller. The plate is mounted on a drum and the drum is caused to rotate in a predetermined direction while the doctor roller is pushed against the surface of the plate. The liquid resin falls from the plate into a collection tray. The collection tray is divided into opposite adjacent resin repository sections, with a separate doctor roller being disposed above each repository section of the collection tray. Incompatible resins can be squeezed into the respective repository sections of the collection tray by the respective rollers by selectively rotating the drum in one direction or the other, and by selectively engaging the plate with one of the rollers while keeping the other roller away from the plate.

8 Claims, 4 Drawing Sheets

ASSEMBLY AND METHOD FOR RECLAIMING INCOMPATIBLE RESINS FROM PRINTING PLATES

BACKGROUND OF THE INVENTION

1. Field of the Invention

This invention relates to an assembly and method for removing nonpolymerized liquid resin from the printing surface of a photopolymerized resin printing plate. More particularly, this invention relates to an assembly and method for removing incompatible resin from photopolymerized resin printing plates.

2. Brief Description of Art

Printing systems utilizing printing plate printing surfaces formed from selectively polymerized photopolymerizable resins are known in the prior art. This type of printing plate is produced by (1) applying a layer of the photopolymerizable resin to a support surface, (2) overlying the resin layer with a negative image of that which is desired to be produced on the printing surface, and (3) exposing the resin to actinic radiation through the negative. The resin layer will thus selectively polymerize in these areas exposed to the actinic radiation so as to form a contoured printing surface. After the polymerized printing surface has been formed, there will remain on the floor of the plate in those areas not exposed to the radiation nonpolymerized liquid resin which must be removed therefrom.

Typical polymers which are used in the above-noted process are F025; F140; G125; F240; LP025; and M045 which are resins manufactured by MacDermid Imaging Technology, of Wilmington, Del. Different ones of these polymers may be used to produce different printing plates at the same production facility. Properties such as photo speed and hardness will determine which of the aforesaid polymers will be used to produce a printing plate. The photo speed will be different for different thickness printing plates, and the hardness of the cured resin will match the type of material it will be used to print on. For example, cardboard boxes will require a softer cured resin, and paper bags will require a harder cured resin.

It is highly desirable to reclaim the liquid nonpolymerized polymer residue from the printing plates for economy of production purposes, and with high cost polymers, reclamation is essential. Nonpolymerized liquid polymer residue can be squeezed or doctored off of the plates and can be recovered for reuse. When the manufacturing process requires the use of incompatible polymers for the production of different printing plates, reclamation is complicated since each of the aforesaid polymers used to produce the printing plates is incompatible with all of the others, thus different resins cannot be recovered at a single recovery station without time-consuming cleaning of the station between recovery operations. Thus, if one were producing printing plates with incompatible resins on the respective plates, in order to recover the nonpolymerized resin from the plates, one would have to include one recovery station for resin A, and a separate recovery station for resin B. This complicates the production facility and increases the cost of producing the printing plates so as to some extent, self-defeat the purpose of recovering nonpolymerized resin in the first place. It would be desirable to include a single resin recovery station in a printing plate production line which could recover incompatible resins from photopolymerized printing plates.

BRIEF SUMMARY OF THE INVENTION

This invention relates to an assembly and a method for removing incompatible photopolymerizable resin liquid residue from photopolymerized polymer printing plates. The method and assembly of this invention may be incorporated into one resin recovery station in a printing plate production facility which will be operable to remove and recover the incompatible resins from separate printing plates without intermixing one resin with the other.

The resin recovery station includes a rotatable drum on which the printing plates can be mounted. The drum is mounted above a resin collection tray which is divided into two parts that are separated by a dam. On opposite walls of the collection tray are mounted selectively extendible and retractable doctor or squeezer rollers. When the rollers are retracted, they will not contact a printing plate mounted on the drum; and when the rollers are extended, they will contact a printing plate mounted on the drum. The drum can be selectively rotated in opposite directions, depending on which printing plate is mounted on the drum.

Thus, the assembly includes: a divided resin collection tray separated by a dam; a rotatable drum mounted above the collection tray, which drum is operable to support printing plates being processed, and selectively rotatable in opposite directions; and selectively extendible and retractable rollers for squeezing liquid polymer off of printing plates mounted on the drum. When printing plate with resin A is mounted on the drum, the drum will be rotated in the clockwise direction and the left hand side doctor roller will be extended so as to squeeze liquid resin off of the printing plate into the left hand side of the divided collection tray. When a printing plate with resin B, which is incompatible wit resin A, is mounted on the drum, the drum will be rotated in the counter-clockwise direction and the right hand side doctor roller will be extended so as to squeeze liquid resin off of the printing plate into the right hand side of the divided collection tray. Extension and retraction of the doctor rollers, as well as reversal of the diction of rotation of the drum, are controlled by a preprogrammed microprocessor controller. The controller will be programmed to rotate the drum in one direction or the other, depending on which resin is being used to produce the printing plates. The operator mounting the printing plates on the drum will signal the controller as to which resin is being reclaimed, and the controller will then know which direction to rotate the drum. The plates are manually mounted on the drum and manually removed therefrom. After mounting a plate on the drum, the operator need merely push a start button to commence the recovery step.

It is therefore an object of this invention to provide an assembly and method for recovering nonpolymerized liquid photopolymer resin from photopolymerized printing plates.

It is a further object of this invention to provide an assembly and method of the character described which can recover incompatible resins from the printing plates at a single station.

These and other objects and advantages of the invention will become more readily apparent from the following detailed description of an embodiment of the invention when taken in conjunction with the accompanying drawings, in which:

DETAILED DESCRIPTION OF THE PREFERRED EMBODIMENTS OF THE INVENTION

Figure 1:
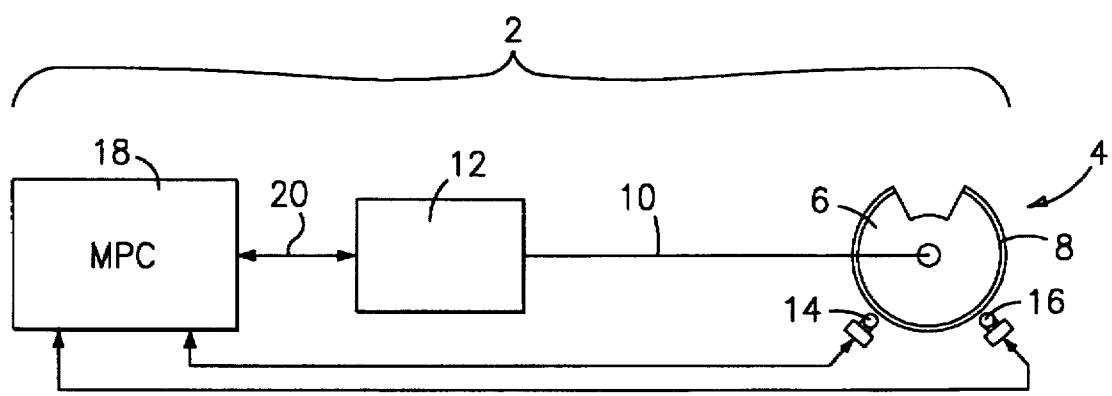
FIG. 1 is a schematic system diagram showing a resin recovery assembly formed in accordance with this invention.

Referring now to the drawings, there is shown in FIG. 1 a schematic system diagram of the various operating components of a resin recovery assembly formed in accordance with this invention. The assembly, which is denoted generally by the numeral 2, includes a resin recovery station 4 having a drum 6 on which a printing plate 8 to be processed is mounted. The drum 6 is mounted on a shaft 10 which is rotatably driven by a reversible stepping motor 12. A pair of resin renewal rollers 14 and 16 are disposed on opposite sides of the drum 6. A microprocessor controller 18 senses and controls the operation of the motor 12 via line 20; and senses and controls operation of the resin removal rollers 16.

Figure 2:
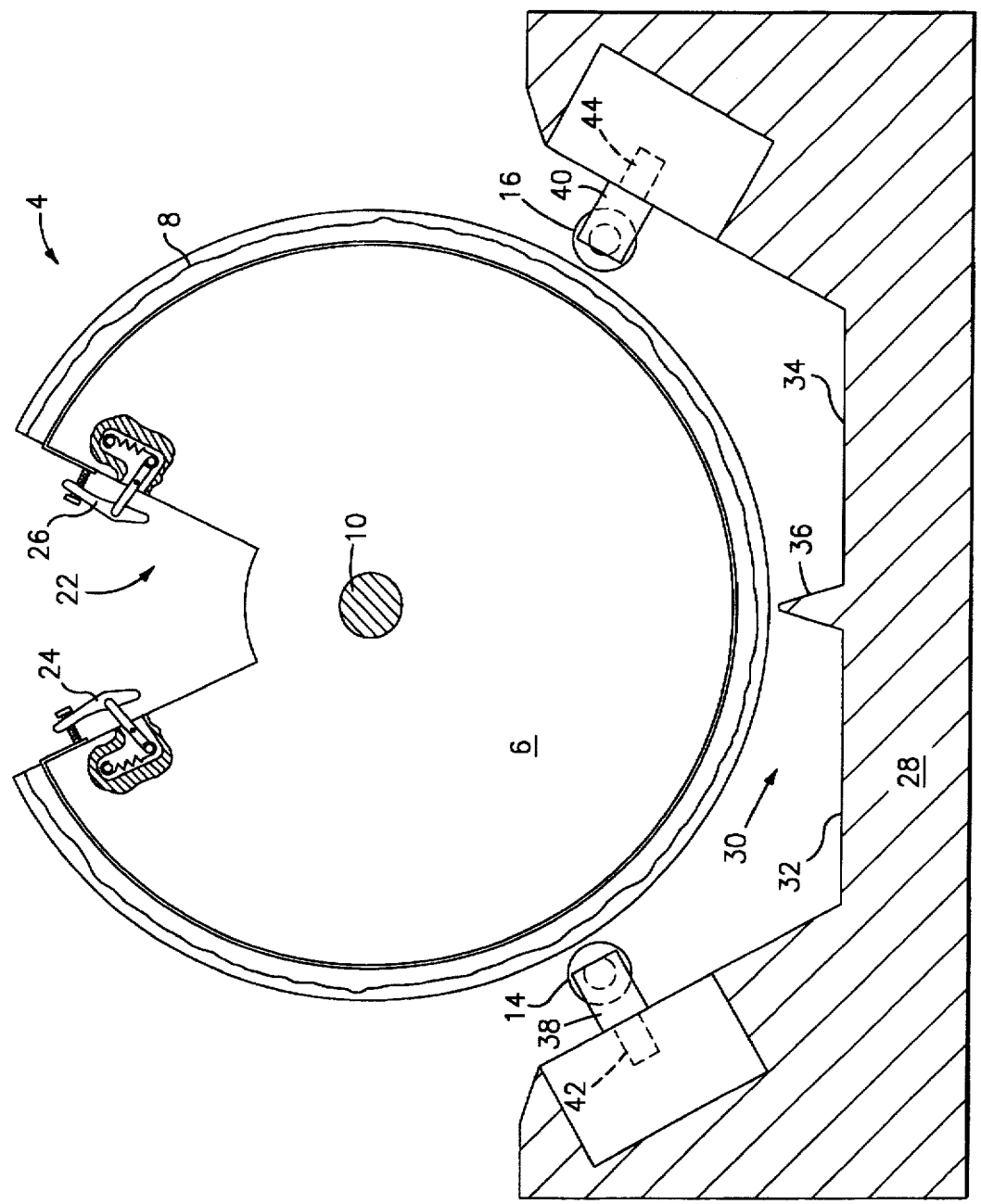
FIG. 2 is a somewhat schematic cross-sectional view of the resin recovery drum, rollers and tray which comprise the resin recovery station in the assembly of this invention.

FIG. 2 shows details of the resin recovery station 4. The drum 6 includes a recessed portion 22 in which spring-biased printing plate clamps 24 and 26 are mounted. Since the length of various printing plates may differ, the clamps 24 and 26 provide some inherent flexibility by reason of the springs. The resin recovery station 4 also includes a resin deposition tray 28 having a trough 30 which is divided into opposite resin repositories 32 and 34 by a dam 36. The resin recovery rollers are 14 and 16 are mounted on forks 38 and 40 respectively. The forks 38 and 40 are disposed on pistons 42 and 44 respectively which are selectively actuated by pneumatic actuators which are controlled by the system microprocessor 18.

Figure 3:
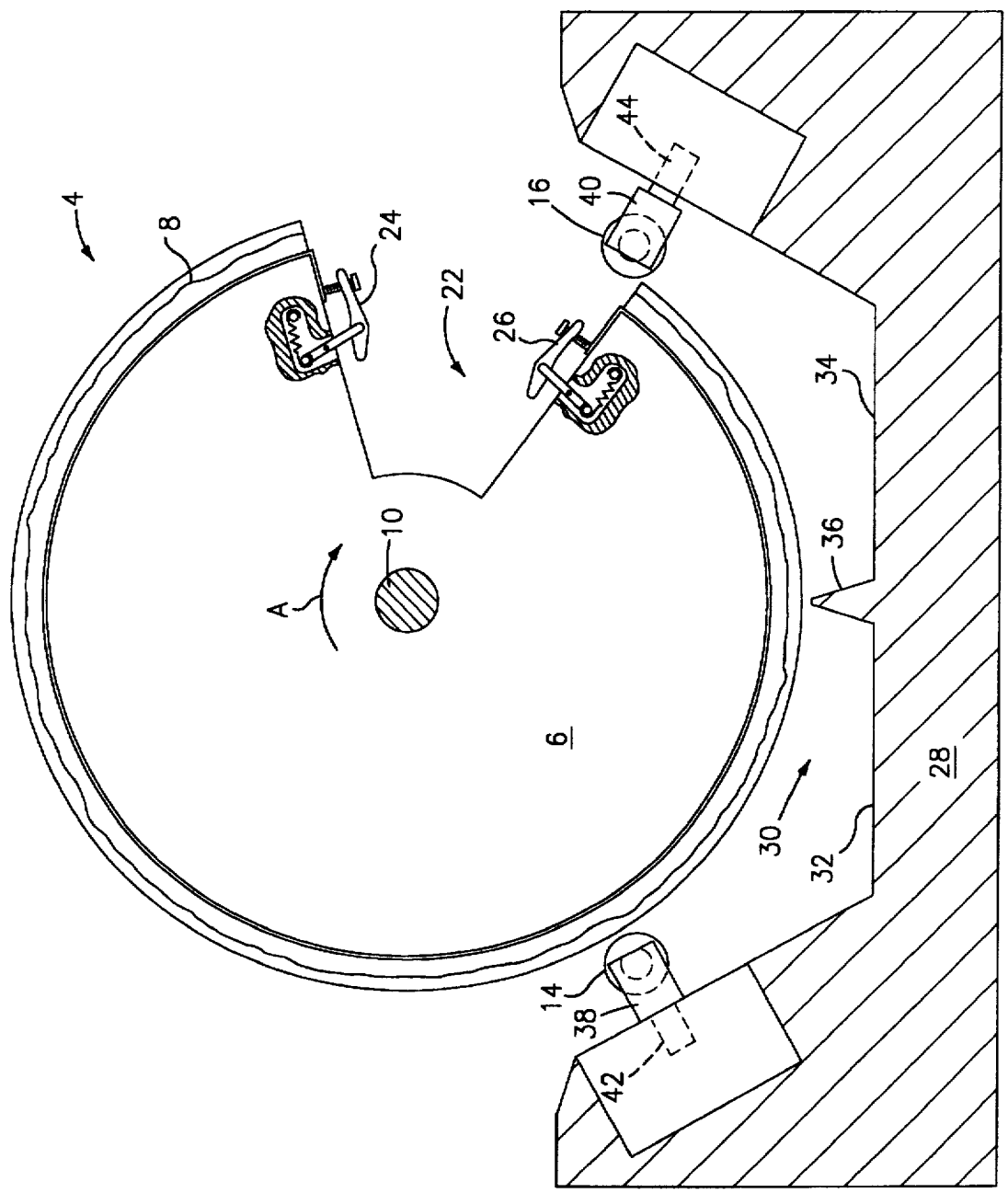
FIG. 3 is a view similar to FIG. 2 but showing the drum rotated to a first position preparatory to wiping liquid resin from a printing plate into a right side of a recovery tray.
Figure 4:
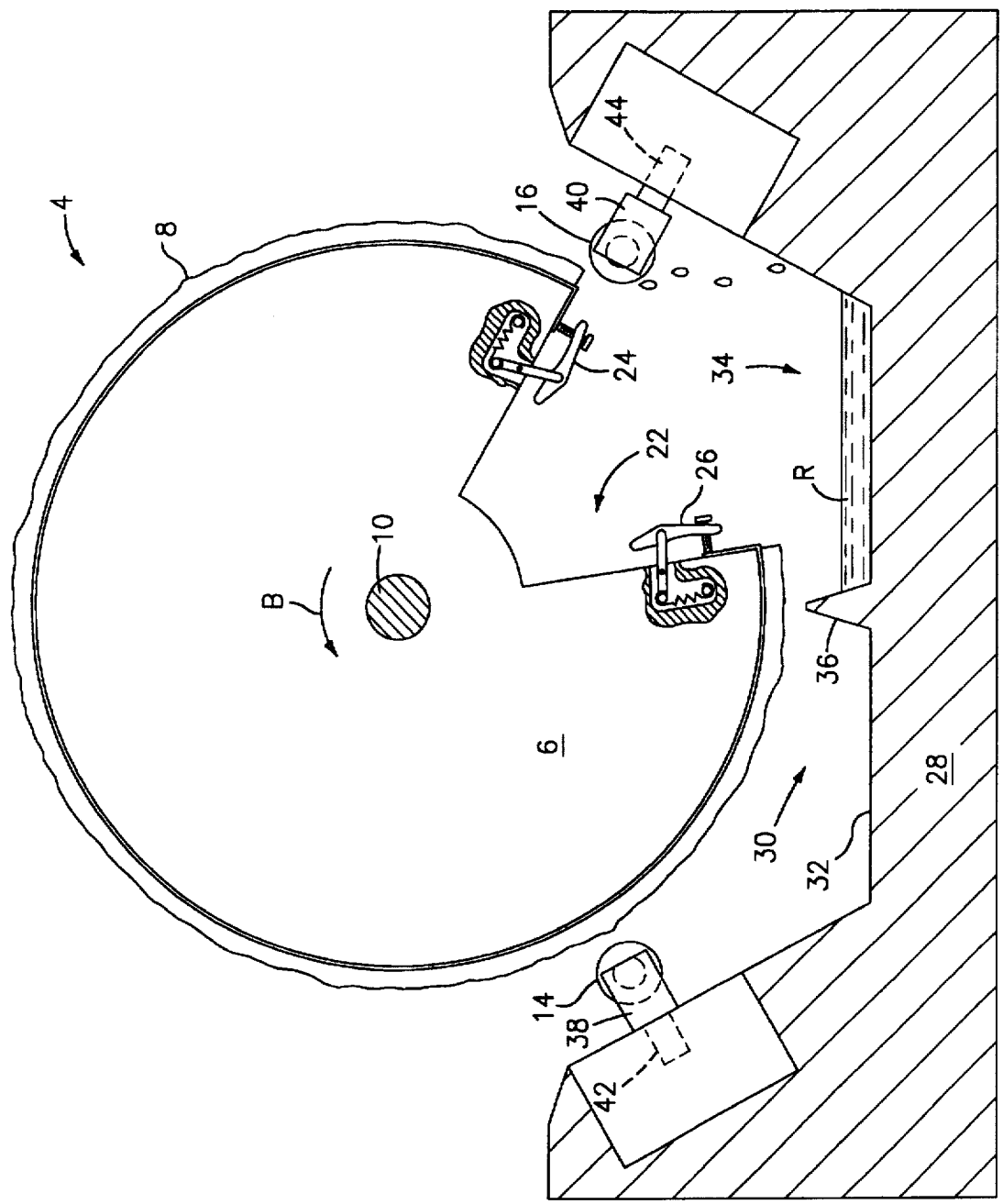
FIG. 4 is a view similar to FIGS. 2 and 3 but showing the drum rotated to a second position subsequent to wiping liquid resin into the right side of the recovery tray.

Referring to FIG. 3, the drum 6 has been rotated in the clockwise direction as indicated by the arrow A so as to move the recess 22 into alignment with the roller 16. The roller 16 is then extended to a position where it will wipe over the outer surface of the printing plate 8 which has the non-crosslinked liquid resin disposed thereon. The drum 6 is then rotated in the counter-clockwise direction as indicated by the arrow B to the position shown in FIG. 4 while the roller 16 remains extended. This results in the liquid resin R being deposited in the right hand repository 34 of the recovery tray 28. When the drum 6 is positioned as shown in FIG. 4, the roller 16 is retracted back to the position shown in FIG. 2. In the event that a non-compatible resin is used to produce an additional plate, the drum 6 will be rotated in the counter-clockwise direction to bring the recess into alignment with the roller 14. The roller 14 will then be extended and the drum 6 will be rotated back in the clockwise direction causing the roller 14 to wipe the liquid resin off of the printing plate 8 so that the resin will be deposited in the left hand repository 32 of the tray 28. The dam 36 keeps the resins in the repositories 32 and 34 of the tray 28 from coming into contact with each other.

It will be readily appreciated that the assembly of this invention can be used to remove and recover non-crosslinked incompatible resins from printing plate at a single station in the printing plate-manufacturing line. The assembly of this invention is compact and can be readily microprocessor-controlled.

Since many changes and variations of the disclosed embodiment of the invention may be made without departing from the inventive concept, it is not intended to limit the invention otherwise than as required by the appended claims.

What is claimed is:

1. A system for removing incompatible liquid photopolymerizable resins from photopolymerized printing plates, said system comprising:
 a) a single station for resin removal;
 b) separate repositories at said station, there being a separate repository for each incompatible resin being removed at said station;
 c) separate resin-removal tools for each separate repository at said station; and
 d) means for holding a printing plate at said station and selectively bringing the printing plate into contact with one of said resin-removal tools so as to remove liquid resin from the plate and deposit the removed resin in one of said resin repositories.

2. The system of claim 1 wherein said means for holding a printing plate is also operable to selectively bring a printing plate into contact with a different one of said resin-removal tools so as to remove liquid resin from the plate and deposit the removed resin in a different one of said repositories.

3. A system for removing non-polymerized liquid polymer from a photopolymerized printing plate, said system comprising:
 a) a drum for receiving and holding a printing plate, said drum being rotatable about an axis;
 b) a trough below said drum, said trough being divided into separate liquid polymer repositories by a dam located below said drum;
 c) liquid polymer-removal members disposed on opposite sides of said drum and above each of said repositories; and
 d) programmed controller means operable to control the direction of rotation of said drum, and also operable to selectively cause one of said polymer-removal members to engage an outer surface of a printing plate disposed on said drum, and remove liquid polymer from the printing plate so as to deposit the removed liquid polymer in a respective one of said repositories.

4. The system of claim 3 wherein said polymer-removal members include rollers on opposite sides of said trough, each of said rollers being mounted on selectively extendible and retractable holders.

5. The system of claim 3 further comprising flexible means for holding different size plates on said drum.

6. A method for removing incompatible liquid photopolymerizable resins from photopolymerized printing plates, said method comprising the steps of:
 a) providing a single station for resin removal;
 b) providing separate repositories at said station, there being a separate repository for each incompatible resin being removed at said station;
 c) providing separate resin-removal tools for each separate repository at said station; and
 d) holding a printing plate at said station and selectively bringing the printing plate into contact with one of said resin-removal tools and removing liquid resin from the plate and depositing the removed resin in one of said resin repositories.

7. The method of claim 6 comprising the alternate step of selectively bringing a printing plate into contact with a different one of said resin-removal tools and removing liquid resin from the plate and depositing the removed resin in a different one of said repositories.

8. A method for removing non-polymerized liquid polymer from a photopolymerized printing plate, said method comprising the steps of:

a) providing a drum for receiving and holding a printing plate, said drum being rotatable about an axis;

b) providing a trough below said drum, said trough being divided into separate liquid polymer repositories by a dam located below said drum;

c) providing liquid polymer-removal tools disposed on opposite sides of said drum and above each of said repositories; and d) rotating said drum in predetermined direction while concurrently engaging an outer surface of a printing plate disposed on said drum with a selected one of said tools, thereby removing liquid polymer from the printing plate and depositing the liquid polymer in a selected one of said repositories.

* * * * *